(12) United States Patent
Lee

(10) Patent No.: US 12,115,562 B2
(45) Date of Patent: Oct. 15, 2024

(54) SUBSTRATE TREATMENT APPARATUS HAVING BACK NOZZLE ASSEMBLY

(71) Applicant: DEVICEENG CO. LTD, Chungcheongnam-do (KR)

(72) Inventor: Taek Youb Lee, Chungcheongnam-do (KR)

(73) Assignee: DEVICEENG CO., LTD, Chungcheongnam-do (KR)

( * ) Notice: Subject to any disclaimer, the term of this patent is extended or adjusted under 35 U.S.C. 154(b) by 395 days.

(21) Appl. No.: 17/562,709

(22) Filed: Dec. 27, 2021

(65) Prior Publication Data
US 2023/0067737 A1   Mar. 2, 2023

(30) Foreign Application Priority Data

Aug. 24, 2021   (KR) ........................ 10-2021-0111359

(51) Int. Cl.
| | | |
|---|---|---|
| B08B 3/02 | (2006.01) | |
| B05B 13/02 | (2006.01) | |
| B08B 3/04 | (2006.01) | |

(52) U.S. Cl.
CPC .......... *B08B 3/022* (2013.01); *B05B 13/0228* (2013.01); *B05B 13/0278* (2013.01); *B08B 3/041* (2013.01)

(58) Field of Classification Search
CPC ........... B08B 3/022; B08B 3/041; B08B 3/02; B05B 13/0228; B05B 13/0278; B05B 1/14; B05B 7/2491; B05B 13/0421; H01L 21/67028; H01L 21/67034; H01L 21/68792; H01L 21/67051; H01L 21/68785

USPC ......................................................... 134/149
See application file for complete search history.

(56) References Cited

U.S. PATENT DOCUMENTS

| | | | | |
|---|---|---|---|---|
| 5,591,262 A | * | 1/1997 | Sago ................. | H01L 21/67051 118/55 |
| 6,247,479 B1 | * | 6/2001 | Taniyama ............... | B08B 3/024 134/133 |
| 6,276,378 B1 | * | 8/2001 | Taniyama ......... | H01L 21/67051 134/902 |
| 8,282,771 B2 | * | 10/2012 | Song ................. | H01L 21/67034 156/345.55 |
| 8,926,788 B2 | * | 1/2015 | Hohenwarter ...... | H01L 21/6719 156/345.55 |
| 10,032,657 B2 | | 7/2018 | Kim | |

(Continued)

FOREIGN PATENT DOCUMENTS

| | | |
|---|---|---|
| KR | 10-2011-0058560 | 6/2011 |
| KR | 101045058 B1 * | 6/2011 |
| KR | 1020170063220 A | 6/2017 |

OTHER PUBLICATIONS

Machine translation of KR-101045058-B1 (Year: 2011).*

*Primary Examiner* — David G Cormier
*Assistant Examiner* — Thomas Bucci
(74) *Attorney, Agent, or Firm* — BLANK ROME LLP

(57) ABSTRACT

The present invention relates to a substrate treatment apparatus including: a substrate support assembly having a chuck base installed rotatably with a rotating shaft; a fluid supply unit for supplying treatment fluid to top of a substrate; and a back nozzle assembly disposed in a hollow portion formed on a central portion of the chuck base to dispense the treatment fluid to the underside of the substrate.

11 Claims, 7 Drawing Sheets

(56) References Cited

U.S. PATENT DOCUMENTS

| | | | |
|---|---|---|---|
| 2002/0179120 A1* | 12/2002 | Ono | H01L 21/67051 134/33 |
| 2007/0089767 A1* | 4/2007 | Yamamoto | B08B 3/02 134/137 |
| 2008/0057219 A1* | 3/2008 | Kim | H01L 21/67051 118/203 |
| 2009/0090467 A1* | 4/2009 | Lee | H01L 21/6875 156/345.55 |
| 2009/0205155 A1* | 8/2009 | Itoh | H01L 21/67051 15/320 |
| 2010/0126962 A1* | 5/2010 | Lee | H01L 21/6875 156/345.55 |
| 2010/0200547 A1* | 8/2010 | Higashijima | H01L 21/6708 134/102.2 |
| 2013/0258300 A1* | 10/2013 | Nishiyama | B08B 3/04 15/21.1 |
| 2017/0001223 A1* | 1/2017 | Lee | H01L 21/02052 |
| 2017/0153550 A1* | 6/2017 | Kim | G03F 7/162 |
| 2017/0278729 A1* | 9/2017 | Hayashi | B08B 3/08 |
| 2018/0182645 A1* | 6/2018 | Nakano | H01L 21/67051 |
| 2018/0315624 A1* | 11/2018 | Nakamura | H01L 21/67034 |
| 2019/0043740 A1* | 2/2019 | Miyahara | H01L 21/68728 |
| 2019/0262851 A1* | 8/2019 | Iwao | B05B 14/00 |
| 2020/0402836 A1* | 12/2020 | Park | H01L 21/68785 |
| 2021/0020465 A1* | 1/2021 | Jo | H01L 21/68764 |
| 2022/0203408 A1* | 6/2022 | Lim | F26B 3/04 |

* cited by examiner

SUBSTRATE TREATMENT APPARATUS HAVING BACK NOZZLE ASSEMBLY

BACKGROUND OF THE INVENTION

Cross Reference to Related Application of the Invention

The present application claims the benefit of Korean Patent Application No. 10-2021-0111359 filed in the Korean Intellectual Property Office on Aug. 24, 2021, the entire contents of which are incorporated herein by reference.

FIELD OF THE INVENTION

The present invention relates to a substrate treatment apparatus having a back nozzle assembly, and more specifically, to a substrate treatment apparatus having a back nozzle assembly for treating the underside of a substrate using a treatment liquid or gas.

BACKGROUND OF THE RELATED ART

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In a state where the substrate is supported on top of a spin head (chuck base), first, treatment liquids are supplied to top or underside of the substrate, while the spin head is rotating at a high speed.

To supply the treatment liquids to the underside of the substrate, accordingly, a back nozzle assembly is disposed in the chuck base under the substrate and configured to have a flow path adapted to dispense a purge gas such as nitrogen $N_2$ so that the treatment liquids remaining on top of the back nozzle assembly are pushed to the outside and thus prevented from flowing between a rotary part and a non-rotary part.

However, a conventional purge gas supply flow path as disclosed in Korean Patent Application No. 10-2011-0058560 (filed on Jun. 1, 2011) is very complicated in structure and hard to be manufactured disadvantageously. Due to the complication in structure, accordingly, the purge gas supply flow path may be blocked by means of particles generated during the use of the back nozzle assembly.

Further, a support structure for radially supporting back nozzles constituting the back nozzle assembly may not support the back nozzles firmly, so that while a spin head is rotating, unfortunately, the back nozzles may swing due to the minute vibrations generated by the rotation of the spin head, thereby ensuring no uniform dispensing of treatment liquids.

If cleaning, rinsing, and drying back nozzles are provided, further, the treatment liquids remaining on the front end peripheries of the respective back nozzles are influenced by post-processes, which causes the substrate to be stained or damaged.

SUMMARY OF THE INVENTION

Accordingly, the present invention has been made in view of the above-mentioned problems occurring in the related art, and it is an object of the present invention to provide a substrate treatment apparatus having a back nozzle assembly that is capable of allowing the back nozzle assembly to be simple in structure to prevent treatment liquids from flowing to a flow path and to keep particles generated during the rotation of a bearing from being introduced into the flow path.

It is another object of the present invention to provide a substrate treatment apparatus having a back nozzle assembly that is capable of preventing, when cleaning, rinsing, and drying processes for the underside of a substrate are carried out through back nozzles, respectively, treatment liquids used in pre-processes from being mixed with treatment liquids used in post-processes, thereby avoiding the substrate from being damaged.

It is yet another object of the present invention to provide a substrate treatment apparatus having a back nozzle assembly that is capable of reliably supporting outer peripheral surfaces of back nozzles to improve durability of the back nozzles and to prevent the dispensing directions of the back nozzles from being changed.

To accomplish the above-mentioned objects, according to one aspect of the present invention, there is provided a substrate treatment apparatus including: a substrate support assembly having a chuck base installed rotatably with a rotating shaft; a fluid supply unit for supplying a treatment fluid to a top of a substrate; and a back nozzle assembly disposed in a hollow portion formed on a central portion of the chuck base to dispense the treatment fluid to an underside of the substrate, wherein the back nozzle assembly may include: a nozzle housing disposed in the hollow portion of the chuck base and having an installation hole penetrated thereinto; a nozzle body passing through the installation hole of the nozzle housing and disposed within an the inner peripheral surface of the nozzle housing with a ring-shaped flow path interposed therebetween; a hollow nozzle shaft coupled to a lower end periphery of the nozzle body; back nozzles passing through an installation wall disposed on top of the nozzle body and protruding upward from the nozzle body; and a purge unit having the ring-shaped flow path, a gas supply passage for supplying a purge gas to the ring-shaped flow path, and an exhaust passage for exhausting the purge gas from the ring-shaped flow path, the ring-shaped flow path having a buffer for receiving the purge gas from the gas supply passage, a first purge flow path extended from a top of the buffer up to a top opened between the nozzle body and the nozzle housing, and a second purge flow path extended from the top of the buffer down to a bearing disposed between the rotating shaft and the nozzle shaft.

According to the present invention, desirably, the second purge flow path is curvedly bent from the buffer and then vertically extended downward.

According to the present invention, desirably, the second purge flow path and the buffer have an L-shaped sectional shape, together.

According to the present invention, desirably, a length of the second purge flow path extended from top of the buffer is longer than a length of the first purge flow path extended from top of the buffer.

According to the present invention, desirably, the length of the second purge flow path extended from top of the buffer is longer by 4 to 10 times than the length of the first purge flow path extended from top of the buffer.

To accomplish the above-mentioned objects, according to another aspect of the present invention, there is provided a substrate treatment apparatus including: a substrate support assembly having a chuck base installed rotatably with a rotating shaft; a fluid supply unit for supplying treatment fluid to top of a substrate; and a back nozzle assembly disposed in a hollow portion formed on a central portion of the chuck base and having a plurality of back nozzles for dispensing the treatment fluid to an underside of the substrate, wherein the back nozzles may include a cleaning back nozzle, a rinsing back nozzle, and a drying back nozzle, a top end portion of the drying back nozzle being highest in height among the back nozzles, a top end portion of the rinsing back nozzle being the second in height, and a top end portion of the cleaning back nozzle being lowest in height among the back nozzles.

According to the present invention, desirably, the back nozzle assembly may include a nozzle skirt disposed on top thereof, and the top end portions of the back nozzles pass through the nozzle skirt.

To accomplish the above-mentioned objects, according to yet another aspect of the present invention, there is provided a substrate treatment apparatus including: a substrate support assembly having a chuck base installed rotatably with a rotating shaft; a fluid supply unit for supplying treatment fluid to top of a substrate; and a back nozzle assembly disposed in a hollow portion formed on a central portion of the chuck base to dispense the treatment fluid to an underside of the substrate, wherein the back nozzle assembly may include: a nozzle housing disposed in the hollow portion of the chuck base and having an installation hole penetrated thereinto; a nozzle body passing through the installation hole of the nozzle housing and disposed within an inner peripheral surface of the nozzle housing with a ring-shaped flow path interposed therebetween; a hollow nozzle shaft coupled to a lower end periphery of the nozzle body; back nozzles passing through an installation wall disposed on top of the nozzle body and protruding upward from the nozzle body; and a purge unit having the ring-shaped flow path, a gas supply passage for supplying a purge gas to the ring-shaped flow path, and an exhaust passage for exhausting the purge gas from the ring-shaped flow path, and the nozzle body may include: an installation wall formed on top thereof; a hollow groove open on underside of the installation wall; a plurality of insertion holes formed on the installation wall disposed on top thereof to fit the back nozzles thereto; and a pipe fixing unit disposed between an inner peripheral surface of the hollow groove and an outer peripheral surface of a back nozzle disposed on the central portion of the installation wall to support the outer peripheral surface of the back nozzle disposed on the central portion of the installation wall.

According to the present invention, desirably, the pipe fixing unit may include two U-shaped coupling pieces facing each other around the back nozzle disposed on the central portion of the installation wall, and an outer peripheral surfaces of the U-shaped coupling pieces are tightly coupled to the inner peripheral surface of the hollow groove, whereas an inner peripheral surfaces of the U-shaped coupling pieces come into close contact with the outer peripheral surface of the back nozzle disposed on the central portion of the installation wall.

According to the present invention, desirably, radiuses of the inner peripheral surfaces of the U-shaped coupling pieces may be slightly smaller than radius of the outer peripheral surface of the back nozzle disposed on the central portion of the installation wall, so that the U-shaped coupling pieces and the back nozzle disposed on the central portion of the installation wall are tightly fitted to each other.

According to the present invention, desirably, the U-shaped coupling pieces may include coupling holes penetrated thereinto and screws pass through the coupling holes and are fixedly coupled to a top portion of the hollow groove formed on the underside of the nozzle body.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
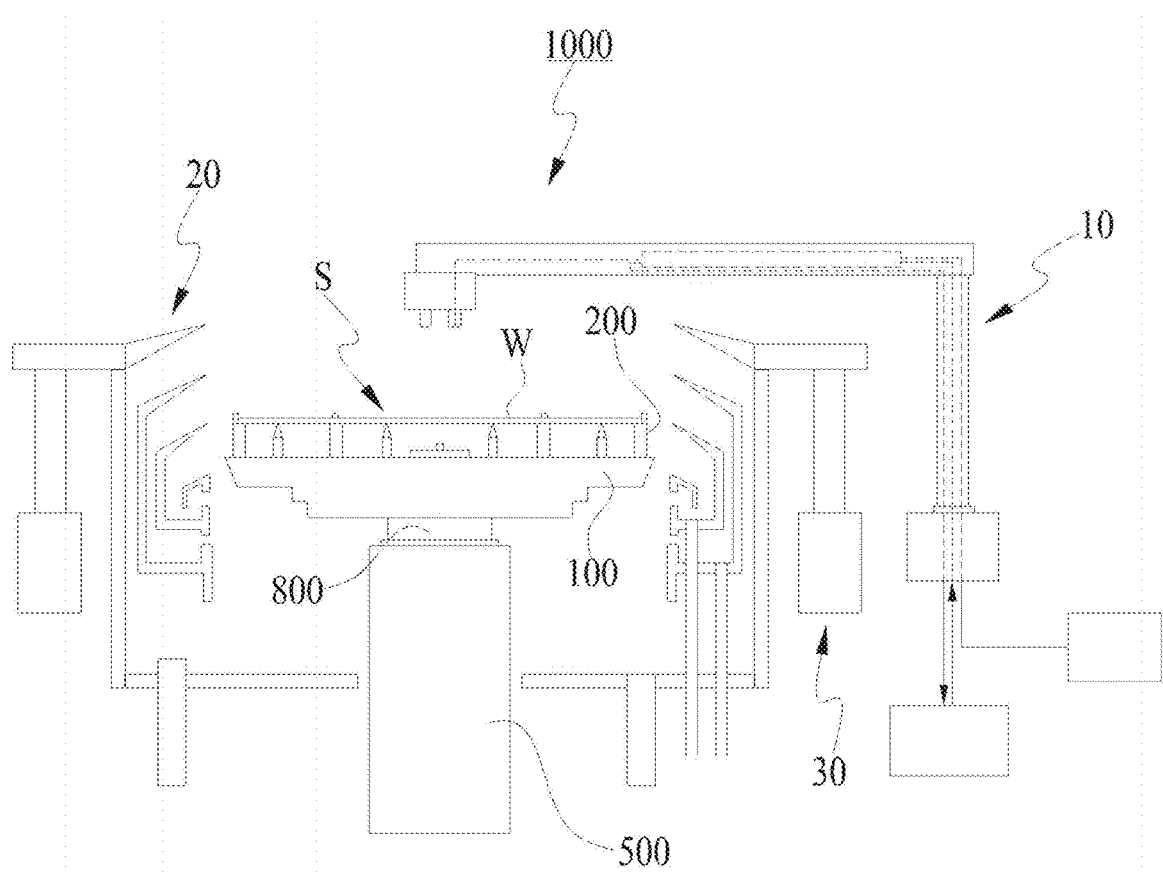
FIG. 1 is a side sectional view showing a substrate treatment apparatus according to the present invention.

As shown in FIG. 1, a substrate treatment apparatus 1000 according to the present invention includes a fluid supply unit 10, a bowl assembly 20, an ascending and descending unit 30, and a substrate support assembly S.

The fluid supply unit 10 supplies substrate treatment fluid such as treatment liquids or gases to a top of a substrate W.

The bowl assembly 20 serves to receive chemical liquids used for treatments and fumes generated during the treatments to prevent the chemical liquids and fumes from scattering or flowing to the outside and has a stacked structure of bowls so that different kinds of chemical liquids and fumes are distinguishedly introduced thereinto according to relative heights of the bowls to the substrate W.

The ascending and descending unit 30 serves to move up and down the substrate support assembly S or the bowl assembly 20 to change a relative height between the bowl assembly 20 and the substrate support assembly S within the bowl assembly 20.

Figure 2:
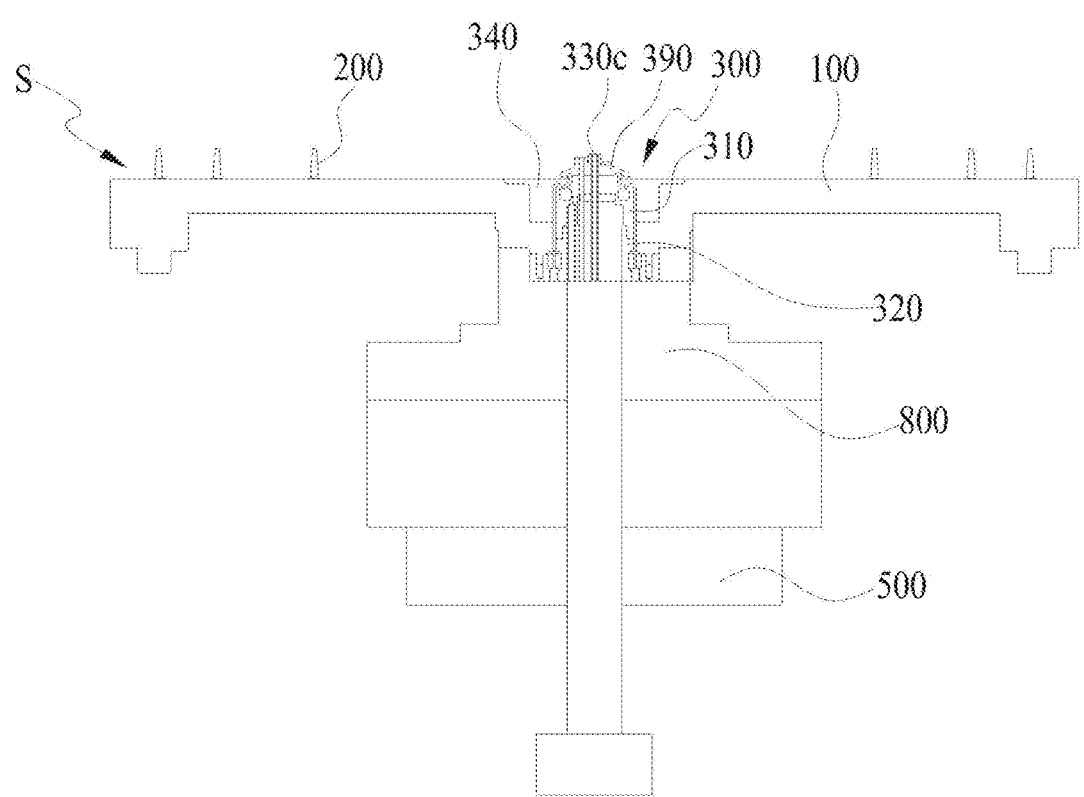
FIG. 2 is a side sectional view showing a coupling structure between a substrate support assembly and a back nozzle assembly of FIG. 1.

Further, as shown in FIGS. 1 and 2, the substrate support assembly S serves to rotate the substrate W in a state of supporting the substrate W, while a given treatment is being carried out, and includes a chuck base 100 disposed opposite to the substrate W under the substrate W and installed rotatably with a rotating shaft 800 and chuck pins 200 disposed on top of the chuck base 100 to support the substrate W.

Figure 3:
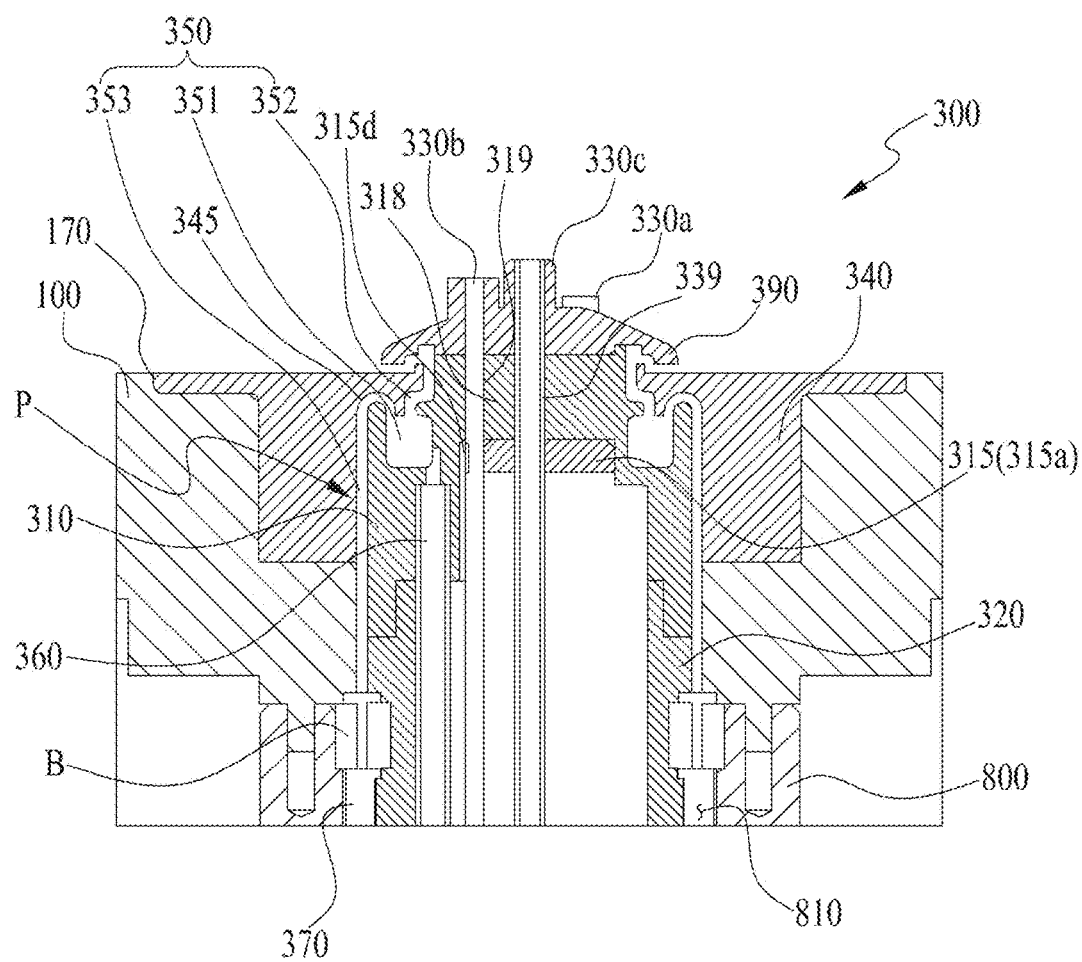
FIG. 3 is an enlarged side sectional view showing the back nozzle assembly of FIG. 2.

As shown in FIG. 3, the substrate treatment apparatus 1000 according to the present invention includes a back nozzle assembly 300 disposed in a hollow portion 170 formed on a central portion of the chuck base 100 to dispense treatment liquids into the underside of the substrate W through back nozzles 330a, 330b, and 330c.

The back nozzle assembly 300 is disposed in the hollow portion 170 of the chuck base 100 and a hollow portion 810 of the rotating shaft 800 and includes a nozzle body 310, a nozzle shaft 320, the back nozzles 330a, 330b, and 330c, a nozzle housing 340, and a purge unit P.

The nozzle housing 340 of the back nozzle assembly 300 is connected to the rotating shaft 800, and as a motor 500 rotates, accordingly, the nozzle housing 340 is rotatable. However, the nozzle body 310 and the nozzle shaft 320 are fixed in position, without any rotation.

The nozzle housing 340 is disposed in the hollow portion 170 formed on the central portion of the chuck base 100 and has an installation hole 345 penetrated thereinto.

The nozzle body 310 passes through the installation hole 345 of the nozzle housing 340 and has an installation wall 318 formed on top thereof and a hollow groove 311 open on underside thereof.

That is, the nozzle housing 340 is coupled to the chuck base 100 and surrounds the nozzle body 310, in a state where the purge unit P is placed between the nozzle housing 340 and the nozzle body 310.

Further, the nozzle body 310 has a plurality of insertion holes 319 formed on the top installation wall 318 to fit the back nozzles 330a, 330b, and 330c thereto.

Figure 5:
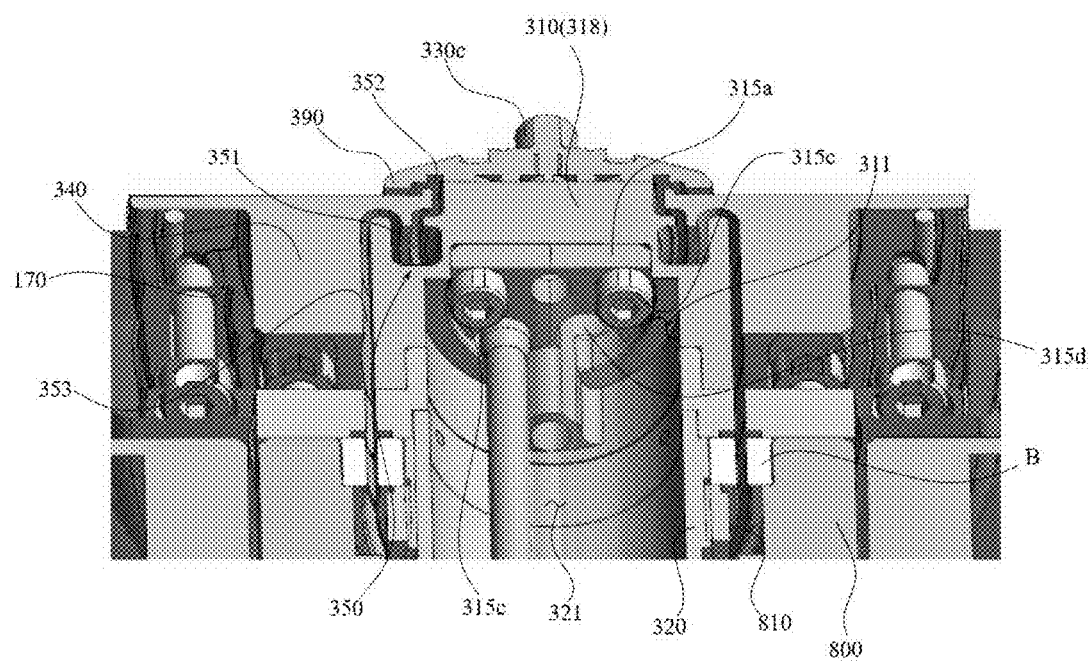
FIG. 5 is a perspective view showing the section of the underside of a pipe fixing unit in the substrate treatment apparatus according to the present invention.

Also, the nozzle shaft 320 is coupled to the lower end periphery of the nozzle body 310 and has a hollow portion 321 whose top and bottom are open (See FIG. 5).

The hollow portion 321 of the nozzle shaft 320 communicates with the hollow groove 311 of the nozzle body 310.

The nozzle shaft 320 is inserted into the hollow portion 810 of the rotating shaft 800, and a bearing B is disposed between the nozzle shaft 320 and the rotating shaft 800.

The outer race of the bearing B is insertedly fixed to the inner peripheral surface of the rotating shaft 800, and the nozzle shaft 320 is insertedly fixed to the inner race of the bearing B.

The rotating shaft 800 rotates by means of the motor 500, but the nozzle shaft 320 is insertedly fixed to the inner race of the bearing B, without any rotation.

Through the above-mentioned relations, as a result, the chuck base 100, the rotating shaft 800, and the nozzle housing 340 constitute a rotary part rotating by the operation of the motor 500 (See FIG. 2), and contrarily, the nozzle body 310, the nozzle shaft 320, and the back nozzles 330a, 330b, and 330c constitute a non-rotary part that does not rotate.

The back nozzles 330a, 330b, and 330c, which dispense chemical liquids (treatment liquids), are extended up to the hollow groove 311 of the nozzle body 310 and the hollow portion 321 of the nozzle shaft 320, and tops of the back nozzles 330a, 330b, and 330c protrude upwardly from the nozzle body 310.

According to the present invention, as shown in FIG. 3, the purge unit P includes a ring-shaped flow path 350, a gas supply passage 360, and an exhaust passage 370.

The ring-shaped flow path 350 is a space portion formed between the nozzle body 310 constituting the non-rotary part and the nozzle housing 340 constituting the rotary part.

Further, the gas supply passage 360 serves to supply a purge gas such as nitrogen $N_2$ to the flow path 350.

Some of the purge gas are dispensed to the underside of the substrate W through the flow path 350 to prevent the chemical liquids dispensed through the back nozzles 330a, 330b, and 330c from flowing back to the flow path 350 and to push the treatment liquids dropped after the dispensing to the underside of the substrate W to the outside.

Further, some of the purge gas prevent an air flow containing the particles generated when the bearing B rotates from being dispensed to the underside of the substrate W through the flow path 350.

The exhaust passage 370 serves to downwardly exhaust the purge gas that prevents the air flow containing the particles from flowing and the air flow containing the particles that is prevented from flowing.

As shown, the exhaust passage 370 is formed between the inner peripheral surface of the rotating shaft 800 and the outer peripheral surface of the nozzle shaft 320.

The ring-shaped flow path 350 includes a buffer 351, a first purge flow path 352, and a second purge flow path 353.

The buffer 351 has the shape of a ring and is disposed between the nozzle body 310 and the nozzle housing 340.

The purge gas supplied from the gas supply passage 360 is filled in the buffer 351.

As the purge gas is filled in the buffer 351, an internal pressure in the buffer 351 becomes increased.

The first purge flow path 352 provides a flow path for dispensing the purge gas filled in the buffer 351 to the underside of the substrate W.

The first purge flow path 352 is approximately ring-shaped and extended from top of the buffer 351 up to the top opened between the nozzle body 310 and the nozzle housing 340.

The second purge flow path 353 is approximately ring-shaped and extended up to the bearing B between the rotating shaft 800 and the nozzle shaft 320.

In specific, the second purge flow path 353 protrudes upwardly from the buffer 351, is primarily bent, and is then extended downward up to the bearing B.

Under the above-mentioned configuration, the first purge flow path 352 and the second purge flow path 353 are connected to top of the buffer 351 in a state of being spaced apart from each other, and the buffer 351 has an L-shaped section together with the second purge flow path 353. Accordingly, the purge gas such as $N_2$ supplied from the lower side surface of the buffer 351 is relatively uniformly divided into the first purge flow path 352 and the second purge flow path 353 and then exhausted.

The second purge flow path 353 is primarily bent from the buffer 351 and then vertically extended downward.

Figure 4:
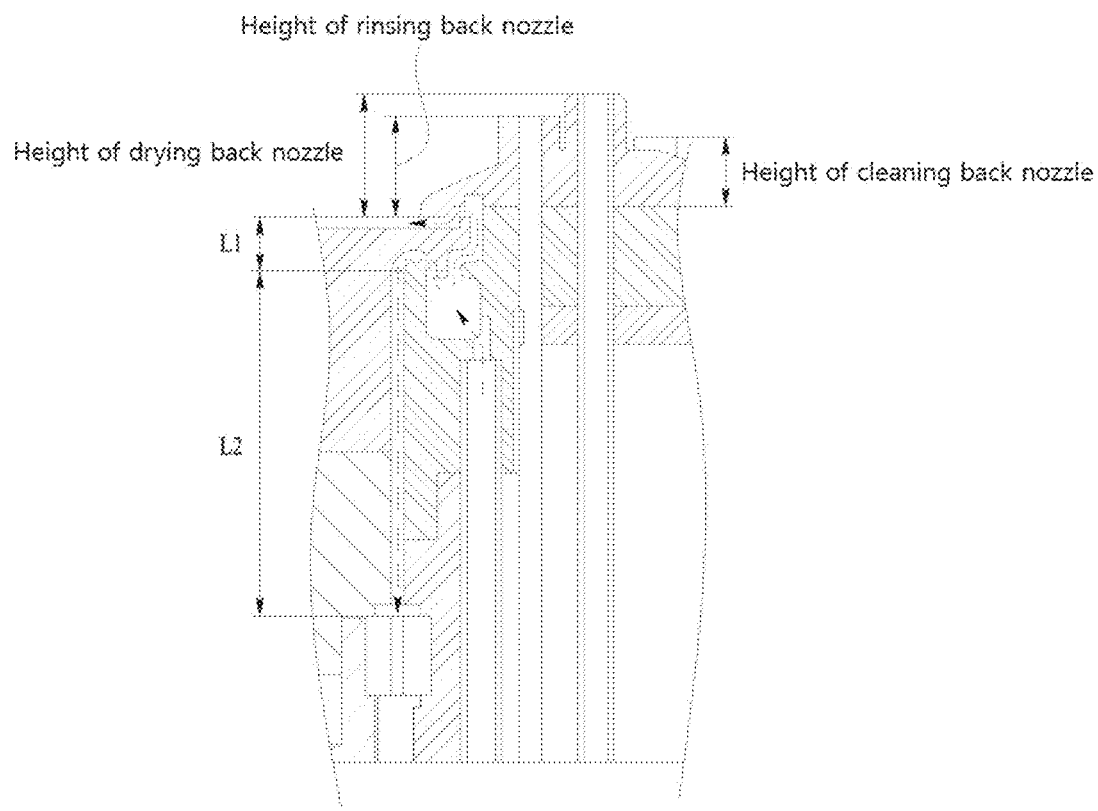
FIG. 4 is a side sectional view showing a structure of a purge unit and an installation structure of back nozzles of FIG. 3.

According to the present invention, as shown in FIG. 4, a length L2 of the second purge flow path 353 extended from top of the buffer 351 is substantially longer than a length L1 of the first purge flow path 352 extended from top of the buffer 351.

Desirably, the length L2 is longer by 4 to 10 times than the length L1.

Under the above-mentioned configuration, it is not easy that the particles generated when the bearing B rotates are raised along the second purge flow path 353, and further, it is almost impossible that the particles are raised by the pressure caused by the purge gas supplied from the buffer 351 and thus discharged above the nozzle body 310, so that the substrate W can be reliably prevented from being damaged by means of the particles.

Moreover, the upward movements of the particles along the second purge flow path 353 through the internal pressure of the buffer 351 can be more effectively suppressed.

Further, as shown in FIG. 3, among the back nozzles 330a, 330b, and 330c for dispensing the chemical liquids (treatment liquids), the back nozzle 330a is a cleaning back nozzle for supplying a chemical liquid for cleaning, the back nozzle 330b is a rinsing back nozzle for dispensing a rinse liquid such as de-ionized water (DIW) for rinsing, and the back nozzle 330c is a drying back nozzle for supplying an isopropyl alcohol (IPA) gas.

The back nozzles 330a, 330b, and 330c are extended to thus pass through the hollow groove 311 of the nozzle body 310 and the hollow portion 321 of the nozzle shaft 320 in up and down directions, and further, top end portions of the back nozzles 330a, 330b, and 330c pass through a nozzle skirt 390 disposed on top of the nozzle body 310 in up and down directions.

The nozzle skirt 390 is disposed on top of the nozzle body 310, while allowing the edge periphery thereof to be spaced apart from top of the nozzle housing 340 to horizontally guide the purge gas exhausted from the first purge flow path 352.

The nozzle skirt 390 serves to support the back nozzles 330a, 330b, and 330c against top thereof and to removably push the treatment liquids or cleaning liquids remaining on top of the rotary part to the outside so that the treatment liquids or cleaning liquids can be prevented from being introduced between the rotary part and the non-rotary part.

If the treatment liquid or cleaning liquid remains on the nozzle housing 340, it is dried through a drying process to cause the underside of the substrate W to be stained and thus damaged.

According to the present invention, as shown in FIG. 4, top end portion of the drying back nozzle 330c is highest in height among the back nozzles, top end portion of the rinsing back nozzle 330b is the second in height, and top end portion of the cleaning back nozzle 330a is lowest in height among the back nozzles.

If it is assumed that top end portion of the cleaning back nozzle 330a is highest in height among the back nozzles, however, the cleaning back nozzle 330a may generate droplets of the cleaning liquid on top end portion thereof by means of the surface tension of the cleaning liquid after dispensing the cleaning liquid, and when the rinse liquid is dispensed through the rinsing back nozzle 330b, next, the droplets of the cleaning liquid may be drawn up or scattered, so that during the rinsing process, the cleaning liquid comes into contact with the underside of the substrate W to thus have bad influences on the substrate W.

If it is also assumed that top end portion of the rinsing back nozzle 330b is higher in height than the drying back nozzle 330c, the rinsing back nozzle 330b may generate droplets of the rinse liquid on top end portion thereof after dispensing the rinse liquid, and next, the droplets of the rinse liquid may be drawn up by a drying gas dispensed through the drying back nozzle 330c, come into contact with the underside of the substrate W, and cause damages such as stains. To prevent the substrate W from being badly influenced by the rinse liquid, accordingly, the rinsing back nozzle 330b is desirably lower in height than the drying back nozzle 330c.

Figure 6:
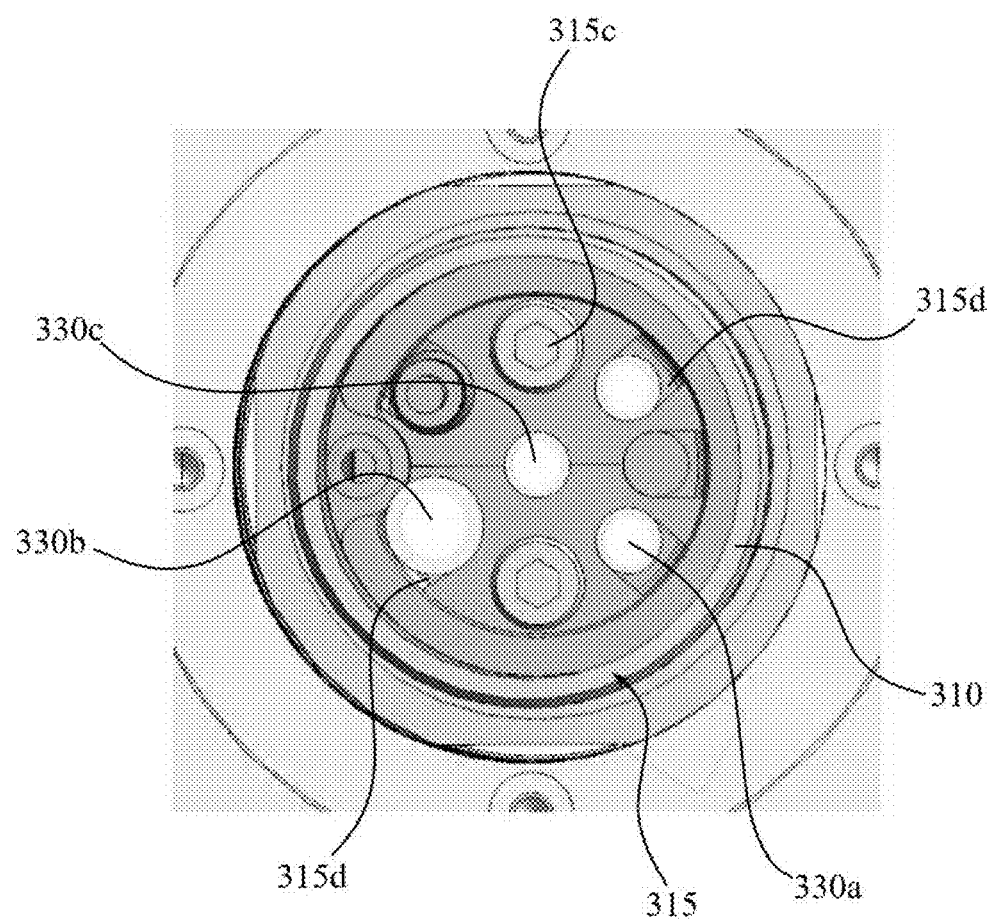
FIG. 6 is an enlarged bottom view showing the pipe fixing unit in the substrate treatment apparatus according to the present invention.
Figure 7:
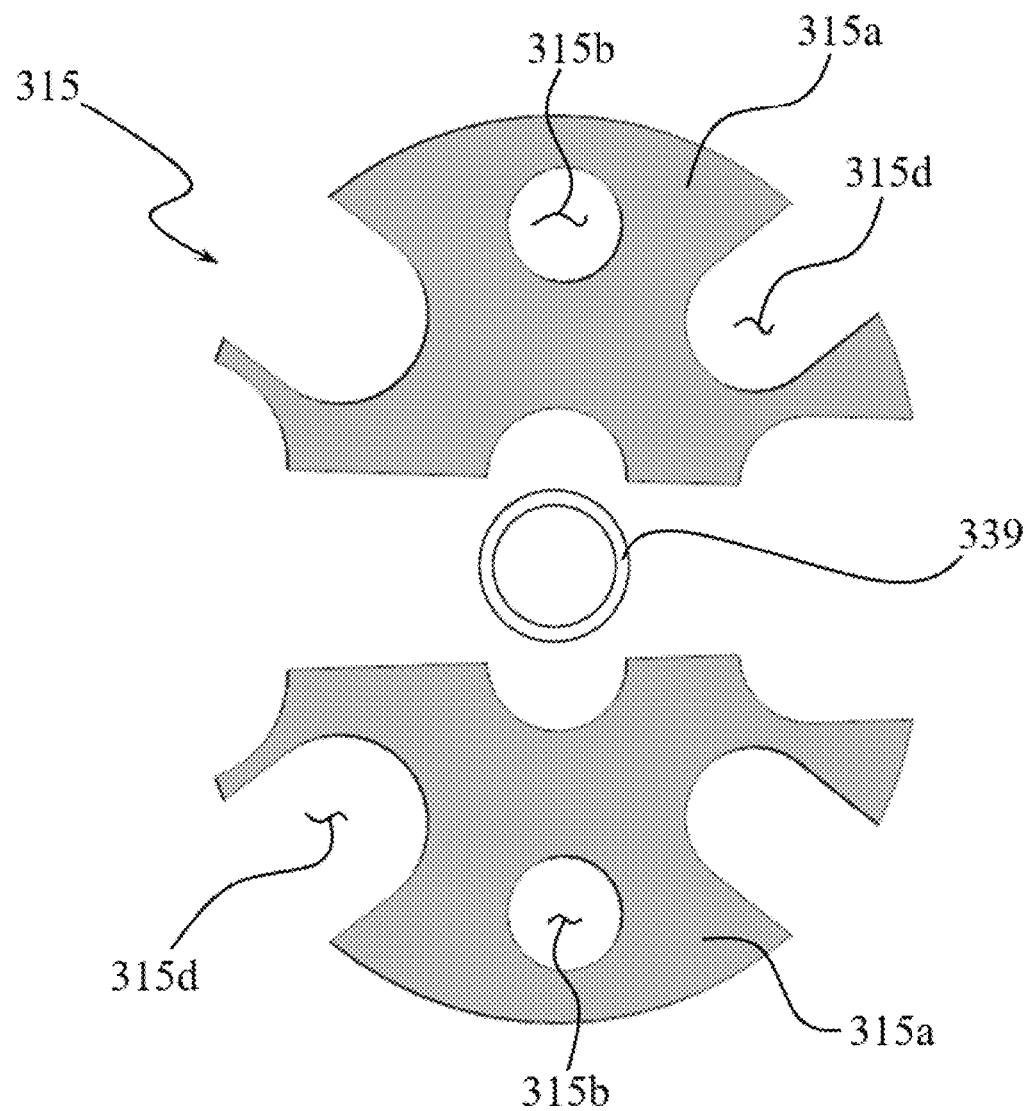
FIG. 7 is an exploded bottom view showing the pipe fixing unit of FIG. 6.

Further, as shown in FIGS. 5 to 7, the nozzle body 310 includes a pipe fixing unit 315 disposed on the hollow groove 311 open on the underside thereof to support an outer peripheral surface of a drying back nozzle pipe 339 disposed on the central portion of the installation wall 318.

In specific, the pipe fixing unit 315 includes two U-shaped coupling pieces 315a facingly coupled to each other around the pipe 339 extended from the drying back nozzle 330c.

The outer peripheral surfaces of the U-shaped coupling pieces 315a are tightly coupled to the inner peripheral surface of the hollow groove 311, and the inner peripheral surfaces thereof come into close contact with the outer peripheral surface of the drying back nozzle 330c.

In this case, desirably, the radiuses of the inner peripheral surfaces of the U-shaped coupling pieces 315a are slightly smaller than the radius of the outer peripheral surface of the drying back nozzle 330c, so that the U-shaped coupling pieces 315a and the drying back nozzle pipe 339 are tightly fitted to each other.

Further, the facing surfaces of the U-shaped coupling pieces 315a may be slightly spaced apart from each other by a given distance.

The U-shaped coupling pieces 315a have coupling holes 315b penetrated thereinto, and accordingly, screws 315c or bolts pass through the coupling holes 315b and are fixedly coupled to a top portion of the hollow groove 311 formed on the underside of the nozzle body 310, so that the U-shaped coupling pieces 315a can be firmly supported against the nozzle body 310, without any movements.

Of course, the U-shaped coupling pieces 315a have support holes or grooves 315d formed thereon, through which the cleaning back nozzle 330a and the rinsing back nozzle 330b supportedly pass.

Through the formation of the support holes or grooves 315d, accordingly, the cleaning back nozzle 330a and the rinsing back nozzle 330b can be reliably prevented from moving laterally.

As described above, the substrate treatment apparatus according to the present invention is configured to have the purge unit having the ring-shaped flow path, the gas supply passage for supplying the purge gas to the ring-shaped flow path, and the exhaust passage for exhausting the purge gas from the ring-shaped flow path, and configured to have the ring-shaped flow path having the buffer for receiving the purge gas from the gas supply passage, the first purge flow path extended from top of the buffer up to the top opened between the nozzle body and the nozzle housing, and the second purge flow path extended up to the bearing disposed between the rotating shaft and the nozzle shaft, so that under the simple configuration, it is possible that the treatment fluid dispensed through the back nozzles can be prevented from flowing to the flow path and the particles generated when the bearing rotates can be prevented from being discharged to the first purge flow path through the buffer.

According to the present invention, further, the second purge flow path is curvedly bent from the buffer and then vertically extended downward, so that the particles generated when the bearing rotates can be more effectively suppressed from entering the buffer.

According to the present invention, moreover, the second purge flow path and the buffer have the L-shaped sectional shape, together, so that the purge gas such as $N_2$ supplied from the lower side surface of the buffer can be uniformly divided into the first purge flow path and the second purge flow path and then exhausted.

According to the present invention, also, the length of the second purge flow path extended from top of the buffer is longer by 4 to 10 times than the length of the first purge flow path extended from top of the buffer, so that the particles can be more effectively prevented from entering the buffer.

According to the present invention, in addition, the back nozzles include the cleaning back nozzle, the rinsing back nozzle, and the drying back nozzle, the top end portion of the drying back nozzle being highest in height among the back nozzles, the top end portion of the rinsing back nozzle being the second in height, and the top end portion of the cleaning back nozzle being lowest in height among the back nozzles, so that the cleaning liquid remaining on the top end portion of the cleaning back nozzle can be prevented from scattering onto the substrate in the rinsing and drying processes to thus avoid the substrate from being stained.

According to the present invention, further, the nozzle body has the installation wall formed on top thereof, the hollow groove open on underside of the installation wall, the plurality of insertion holes formed on the installation wall to fit the back nozzles thereto, and the pipe fixing unit disposed between an inner peripheral surface of the hollow groove and an outer peripheral surface of a back nozzle disposed on the central portion of the installation wall to support the back nozzle disposed on the central portion of the installation wall, so that the back nozzle can be reliably prevented from moving laterally.

According to the present invention, moreover, the pipe fixing unit includes the two U-shaped coupling pieces facingly coupled to each other around the back nozzle disposed on the central portion of the installation wall, and the outer peripheral surfaces of the U-shaped coupling pieces are tightly coupled to the inner peripheral surface of the hollow groove, whereas the inner peripheral surfaces of the U-shaped coupling pieces come into close contact with the outer peripheral surface of the back nozzle disposed on the central portion of the installation wall, so that the pipe fixing unit can coupledly support the back nozzle with ease, without any movement of the back nozzle.

According to the present invention, also, the radiuses of the inner peripheral surfaces of the U-shaped coupling pieces are slightly smaller than the radius of the outer peripheral surface of the back nozzle disposed on the central portion of the installation wall, so that the U-shaped coupling pieces and the back nozzle disposed on the central portion of the installation wall can be tightly fitted to each other.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate treatment apparatus comprising:
a substrate support assembly having a chuck base installed rotatably with a rotating shaft;
a fluid supply unit for supplying treatment fluid to a top of a substrate; and
a back nozzle assembly disposed in a hollow portion formed on a central portion of the chuck base to dispense the treatment fluid to an underside of the substrate,
wherein the back nozzle assembly comprises:
a nozzle housing disposed in the hollow portion of the chuck base and having an installation hole penetrated thereinto;
a nozzle body passing through the installation hole of the nozzle housing and disposed within an inner peripheral surface of the nozzle housing with a ring-shaped flow path interposed therebetween;
a hollow nozzle shaft coupled to a lower end periphery of the nozzle body;
back nozzles passing through an installation wall disposed on top of the nozzle body and protruding upward from the nozzle body; and
a purge unit having the ring-shaped flow path, a gas supply passage for supplying a purge gas to the ring-shaped flow path, and an exhaust passage for exhausting the purge gas from the ring-shaped flow path,
the ring-shaped flow path comprising a buffer for receiving the purge gas from the gas supply passage, a first purge flow path extended from a top of the buffer up to a top opened between the nozzle body and the nozzle housing, and a second purge flow path extended from the top of the buffer down to a bearing disposed between the rotating shaft and the nozzle shaft.

2. The substrate treatment apparatus according to claim 1, wherein the second purge flow path is curvedly bent from the buffer and then vertically extended downward.

3. The substrate treatment apparatus according to claim 2, wherein the second purge flow path and the buffer have an L-shaped sectional shape, together.

4. The substrate treatment apparatus according to claim 2, wherein a length of the second purge flow path extended from top of the buffer is longer than a length of the first purge flow path extended from top of the buffer.

5. The substrate treatment apparatus according to claim 4, wherein the length of the second purge flow path extended from top of the buffer is longer by 4 to 10 times than the length of the first purge flow path extended from top of the buffer.

6. A substrate treatment apparatus according to claim 1, wherein the back nozzles comprise a cleaning back nozzle, a rinsing back nozzle, and a drying back nozzle, a top end portion of the drying back nozzle being highest in height among the back nozzles, a top end portion of the rinsing back nozzle being the second in height, and a top end portion of the cleaning back nozzle being lowest in height among the back nozzles.

7. The substrate treatment apparatus according to claim 6, wherein the back nozzle assembly comprises a nozzle skirt disposed on top thereof, and the top end portions of the back nozzles pass through the nozzle skirt.

8. A substrate treatment apparatus comprising:
a substrate support assembly having a chuck base installed rotatably with a rotating shaft;
a fluid supply unit for supplying treatment fluid to a top of a substrate; and
a back nozzle assembly disposed in a hollow portion formed on a central portion of the chuck base to dispense the treatment fluid to an underside of the substrate,
wherein the back nozzle assembly comprises:
a nozzle housing disposed in the hollow portion of the chuck base and having an installation hole penetrated thereinto;
a nozzle body passing through the installation hole of the nozzle housing and disposed within an inner peripheral surface of the nozzle housing with a ring-shaped flow path interposed therebetween;
a hollow nozzle shaft coupled to a lower end periphery of the nozzle body;
back nozzles passing through a top of the nozzle body and protruding upward from the nozzle body; and
a purge unit having the ring-shaped flow path, a gas supply passage for supplying a purge gas to the ring-shaped flow path, and an exhaust passage for exhausting the purge gas from the ring-shaped flow path,
the nozzle body comprising an installation wall formed on top thereof, a hollow groove opened on underside thereof, a plurality of insertion holes formed on a central portion of the installation wall to fit the back nozzles thereof, and a pipe fixing unit disposed between an inner peripheral surface of the hollow groove and an outer peripheral surface of a back nozzle disposed on the central portion of the installation wall to support the outer peripheral surface of the back nozzle disposed on the central portion of the installation wall.

9. The substrate treatment apparatus according to claim 8, wherein the pipe fixing unit comprises two U-shaped coupling pieces facing each other around the back nozzle disposed on the central portion of the installation wall, and an outer peripheral surfaces of the U-shaped coupling pieces are tightly coupled to an inner peripheral surface of the hollow groove, whereas an inner peripheral surfaces of the U-shaped coupling pieces come into close contact with the outer peripheral surface of the back nozzle disposed on the central portion of the installation wall.

10. The substrate treatment apparatus according to claim 9, wherein radiuses of the inner peripheral surfaces of the U-shaped coupling pieces are slightly smaller than radius of the outer peripheral surface of the back nozzle disposed on the central portion of the installation wall, so that the U-shaped coupling pieces and the back nozzle disposed on the central portion of the installation wall are tightly fitted to each other.

11. The substrate treatment apparatus according to claim 9, wherein the U-shaped coupling pieces comprise coupling holes penetrated thereinto and screws pass through the coupling holes and are fixedly coupled to a top portion of the hollow groove formed on the underside of the nozzle body.

* * * * *